(12) United States Patent
Kao

(10) Patent No.: US 9,054,106 B2
(45) Date of Patent: Jun. 9, 2015

(54) SEMICONDUCTOR STRUCTURE AND METHOD FOR MANUFACTURING THE SAME

(71) Applicant: UNITED MICROELECTRONICS CORP., Hsinchu (TW)

(72) Inventor: Ching-Hung Kao, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/078,653

(22) Filed: Nov. 13, 2013

(65) Prior Publication Data

US 2015/0129942 A1     May 14, 2015

(51) Int. Cl.
*H01L 23/52* (2006.01)
*H01L 27/14* (2006.01)
*H01L 23/522* (2006.01)
*H01L 27/146* (2006.01)
*H01L 21/768* (2006.01)

(52) U.S. Cl.
CPC ...... *H01L 23/5226* (2013.01); *H01L 27/14636* (2013.01); *H01L 21/76877* (2013.01)

(58) Field of Classification Search
USPC .................................. 257/292, 774; 438/667
See application file for complete search history.

(56) References Cited

U.S. PATENT DOCUMENTS

| | | | |
|---|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |
| 6,087,211 A | 7/2000 | Kalnitsky |
| 6,124,200 A | 9/2000 | Wang |
| 6,294,313 B1 | 9/2001 | Kobayashi |
| 6,297,160 B1 | 10/2001 | Chien |
| 6,338,976 B1 | 1/2002 | Huang |
| 6,352,876 B1 | 3/2002 | Bordogna |

(Continued)

*Primary Examiner* — Mamadou Diallo

(74) *Attorney, Agent, or Firm* — WPAT, PC; Justin King

(57) ABSTRACT

A semiconductor structure and a method for manufacturing the same are provided. A semiconductor structure includes a device substrate, a conductive film, a dielectric film and a conductive plug. The device substrate includes a semiconductor substrate and a conductive structure on an active surface of the semiconductor substrate. The device substrate has a substrate opening passing through the semiconductor substrate and exposing the conductive structure. The conductive film, the conductive plug and the dielectric film between the conductive film and the conductive plug are disposed in the substrate opening.

18 Claims, 4 Drawing Sheets

(56) References Cited

U.S. PATENT DOCUMENTS

| | | |
|---|---|---|
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Lin |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu |
| 8,274,101 B2 | 9/2012 | Venezia |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0315734 A1 | 12/2010 | Wu |
| 2011/0024867 A1 | 2/2011 | Tseng et al. |
| 2011/0057277 A1 | 3/2011 | Yu |
| 2013/0264676 A1* | 10/2013 | Yang et al. .......... 257/508 |
| 2013/0334669 A1* | 12/2013 | Kuo et al. .......... 257/621 |

* cited by examiner though the semiconductor substrate 104 and expose the dielectric film 118 of the dielectric structure 110 by a photolithography process for etching the semiconductor substrate 104 from the back surface 122 of which, such as a wet etching method, a dry etching method, etc.

SEMICONDUCTOR STRUCTURE AND METHOD FOR MANUFACTURING THE SAME

BACKGROUND

1. Technical Field

The disclosure relates to a semiconductor structure and a method for manufacturing the same.

2. Description of the Related Art

With development and growth of electric products such as digital cameras, scanners, etc., demands for image sensors increases in consuming market. Generally, the image sensors include two types of a charge coupled device (CCD) sensor and a CMOS image sensor (CIS). The CMOS image sensor is used in wider applications due to factors of low operating voltage, low power consumption and high operation efficiency, and capabilities of random access according to need and being manufactured by methods integrated with current semiconductor techniques.

SUMMARY

According to one embodiment, a semiconductor structure is provided, which comprises a device substrate, a conductive film, a dielectric film and a conductive plug. The device substrate comprises a semiconductor substrate and a conductive structure on an active surface of the semiconductor substrate. The device substrate has a substrate opening passing through the semiconductor substrate and exposing the conductive structure. The conductive film, the conductive plug and the dielectric film between the conductive film and the conductive plug are disposed in the substrate opening.

According to another embodiment, a method for manufacturing a semiconductor structure is provided, which comprises following steps. A device substrate is provided. The device substrate comprises a semiconductor substrate and a conductive structure on an active surface of the semiconductor substrate. A substrate opening is formed in the device substrate. The substrate opening passes through the semiconductor substrate and exposes the conductive structure. A conductive film is formed in the substrate opening. A dielectric film is formed in the substrate opening. A conductive plug is formed in the substrate opening. The dielectric film is between the conductive film and the conductive plug.

DETAILED DESCRIPTION

FIG. 1 to FIG. 7 illustrate a manufacturing method for a semiconductor structure, such as a backside illuminated CMOS image sensor (BSI CIS), according to one embodiment.

Figure 1:
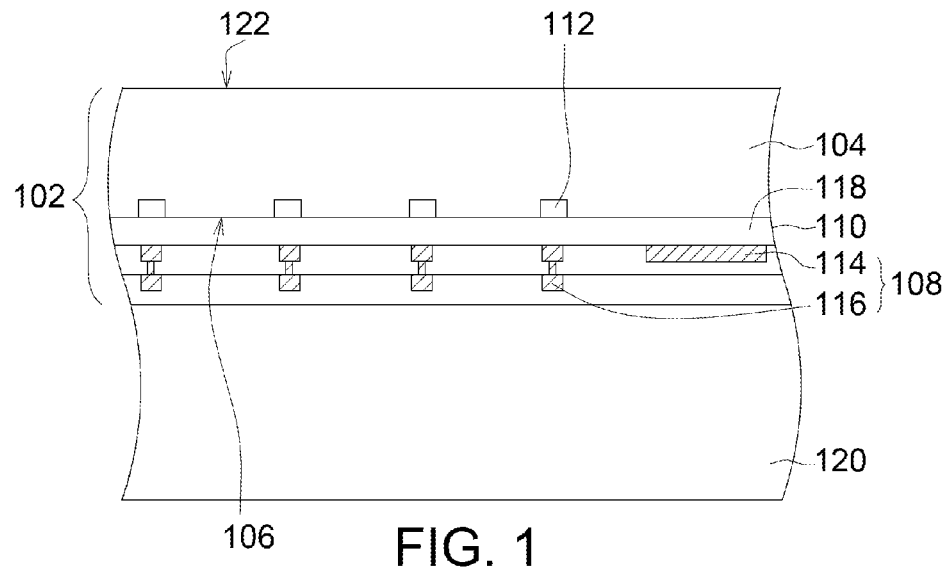
FIG. 1 to FIG. 7 illustrate a manufacturing method for a semiconductor structure according to one embodiment.

Referring to FIG. 1, a device substrate 102 is provided. For example, the device substrate 102 comprises a semiconductor substrate 104, and a conductive structure 108 and a dielectric structure 110 disposed on an active surface 106 of the semiconductor substrate 104. For example, the semiconductor substrate 104 is a substrate or wafer of a (for example doped) silicon or other suitable materials. An isolation structure 112 such as a shallow trench isolation (STI), is formed in the semiconductor substrate 104 for isolating each of pixels in a pixel array region as well as electrical components in a periphery circuit region.

The conductive structure 108 may comprises a contact pad 114 and an interconnect layer 116 in the dielectric structure 110 comprising a plurality of dielectric films comprising a dielectric film 118. The contact pad 114 is disposed on the dielectric film 118 of the dielectric structure 110. The isolation structure 112 and the dielectric structure 110 may comprise an oxide, a nitride or an oxynitride, such as silicon oxide, silicon nitride or silicon oxynitride, or other suitable insulating materials, independently. The contact pad 114 and the interconnect layer 116 may comprise any suitable conductive material such as Al, Cu, Ti, W, etc.

In one embodiment, the device substrate 102 is a CIS wafer, and some components of which are not illustrated herein.

Referring to FIG. 1, the semiconductor substrate 104 is bonded to a carrier substrate 120 with the active surface 106 of the semiconductor substrate 104 facing the carrier substrate 120. The carrier substrate 120 provides mechanical strength and support for subsequent processes, such as a thinning step, to the device substrate 102. The carrier substrate 120 may comprise silicon, glass, or other suitable materials. Then, the semiconductor substrate 104 may be thinned and flattened simultaneously from a back surface 122 of the semiconductor substrate 104 by a chemical mechanical polishing (CMP) method. The carrier substrate 120 may be a silicon wafer. In one embodiment, a thickness of the thinned semiconductor substrate 104 is about 2 μm~3 μm, but not limited thereto, and can be varied according to actual demands. Thinning the semiconductor substrate 104 can increase receiving and sensing efficiency of a sensor such as a LED in the pixel array region for an incident light toward the back surface 122 of the semiconductor substrate 104.

Figure 2:
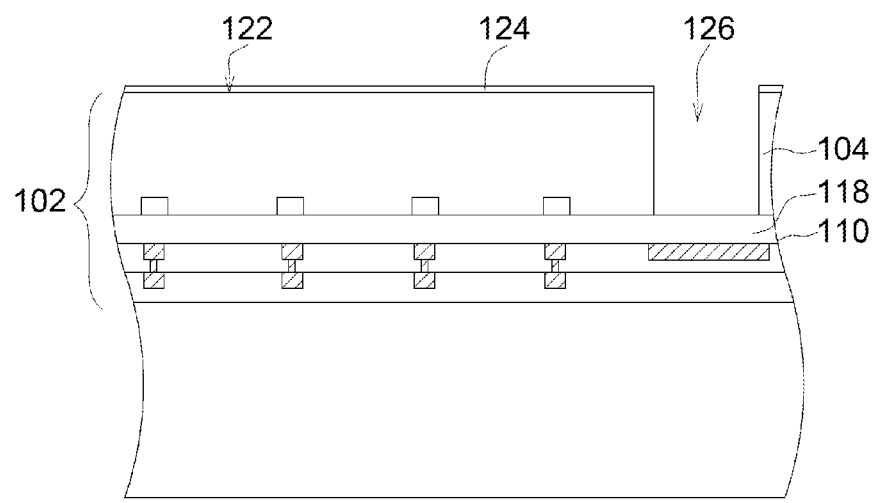

Referring to FIG. 2, anti-reflective layer 124 may be formed on the back surface 122 of the semiconductor substrate 104. Then, a trench 126 may be formed to pass through the semiconductor substrate 104 and expose the dielectric film 118 of the dielectric structure 110 by a photolithography process for etching the semiconductor substrate 104 from the back surface 122 of which, such as a wet etching method, a dry etching method, etc.

Figure 3:
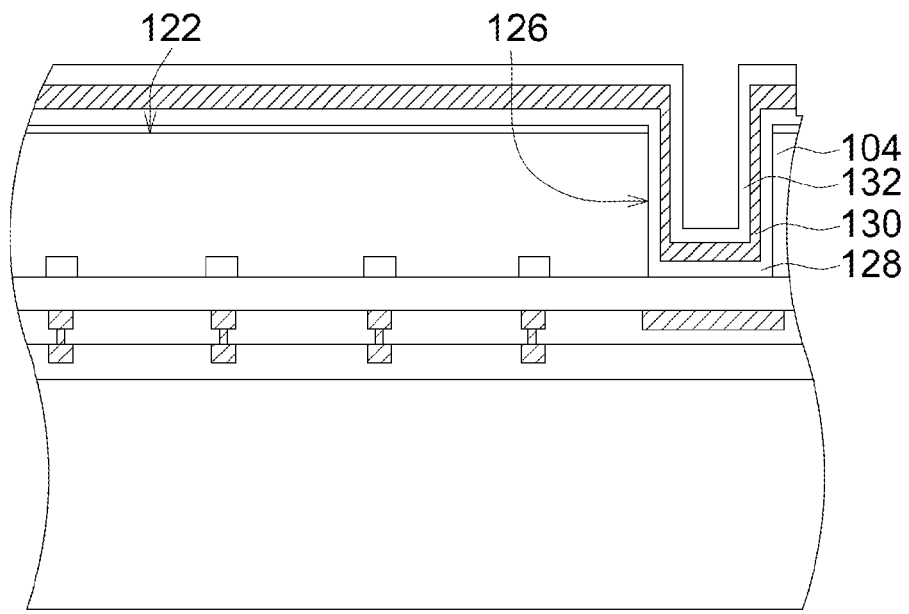

Referring to FIG. 3, a dielectric layer 128, a conductive film 130 and a dielectric film 132 may be sequentially formed in the trench 126 and on the back surface 122 of the semiconductor substrate, by a method comprising a physical vapor deposition, a chemical vapor deposition, an atomic layer deposition, etc, or a combination thereof. In one embodiment, the conductive film 130 comprises a metal such as Ti, TiN, Al, a single-layer structure or a multi-layer structure, such as a Ti/TiN multi-layer structure or a Ti/TiN/Al multi-layer structure, but is not limited thereto, and may use other suitable conductive materials or structure designs. The dielectric layer 128 and the dielectric film 132 may comprise an oxide, a nitride or an oxynitride, such as silicon oxide, silicon nitride or silicon oxynitride, or other suitable insulating materials, independently.

Figure 4:
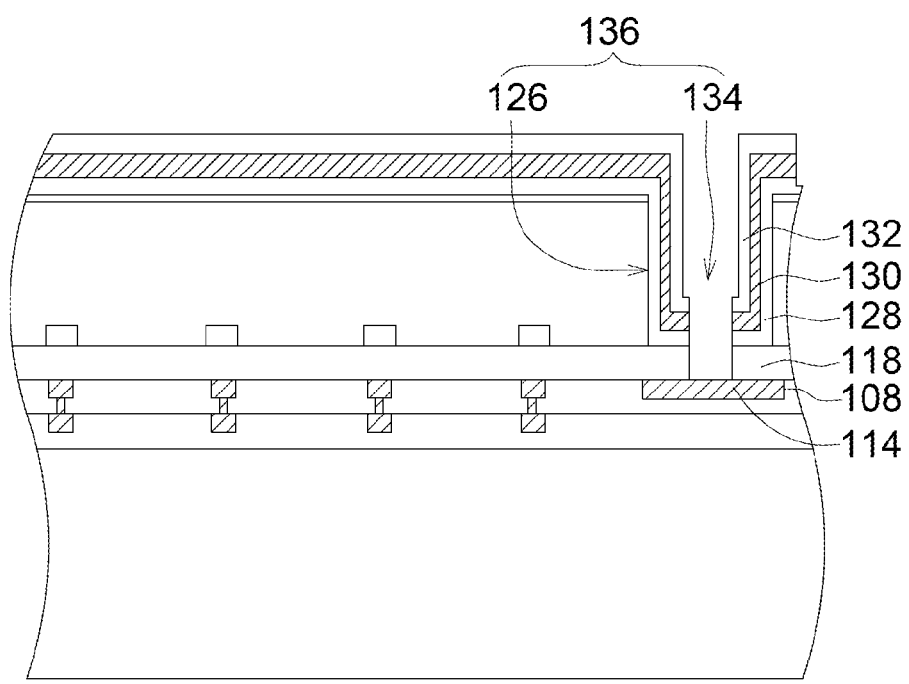

Referring to FIG. 4, a via 134 exposing the contact pad 114 of the conductive structure 108 may be formed by removing lower portions of the dielectric film 132, the conductive film 130 and the dielectric layer 128 in the trench 126 and the underlying dielectric film 118 by a photolithography process. The removing method comprises a wet etching step or a dry etching step, etc. A substrate opening 136 comprises the trench 126 and the via 134 narrower than the trench 126. As observed in the cross-section view shown in FIG. 4, after the via 134 is formed, the dielectric layer 128, the dielectric film 132 and the conductive film 130 in the substrate opening 136 have a L shape respectively.

Figure 5:
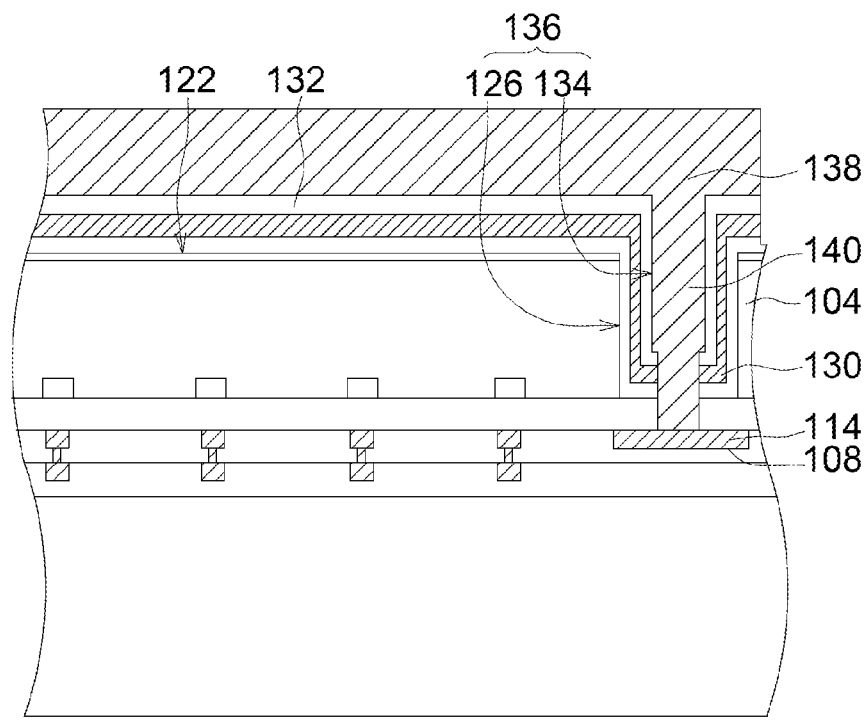

Referring to FIG. 5, a conductive material 138 is formed in the substrate opening 136 and on the dielectric film 132 on the back surface 122 of the semiconductor substrate 104. A portion of the conductive material 138 in the via 134 forms a conductive plug 140 electrically connected to the conductive film 130 and the contact pad 114 of the conductive structure 108. In one embodiment, the conductive material 138 comprises a metal such as AlCu, but is not limited thereto. The conductive material 138 may be formed by a method comprising a physical vapor deposition, a chemical vapor deposition, an atomic layer deposition, etc, or a combination thereof.

Figure 6:
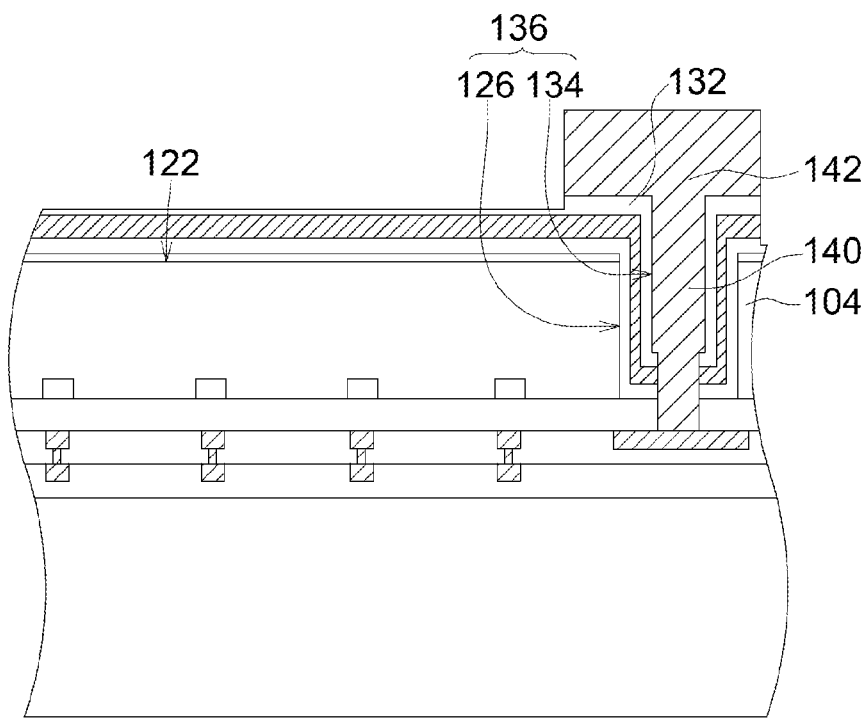

Referring to FIG. 6, a portion of the conductive material 138 (FIG. 5) on the back surface 122 of the semiconductor substrate 104 is patterned to form a conductive pad 142 electrically connected to the conductive plug 140 and protruding from the dielectric film 132 on the back surface 122 of the semiconductor substrate 104.

Figure 7:
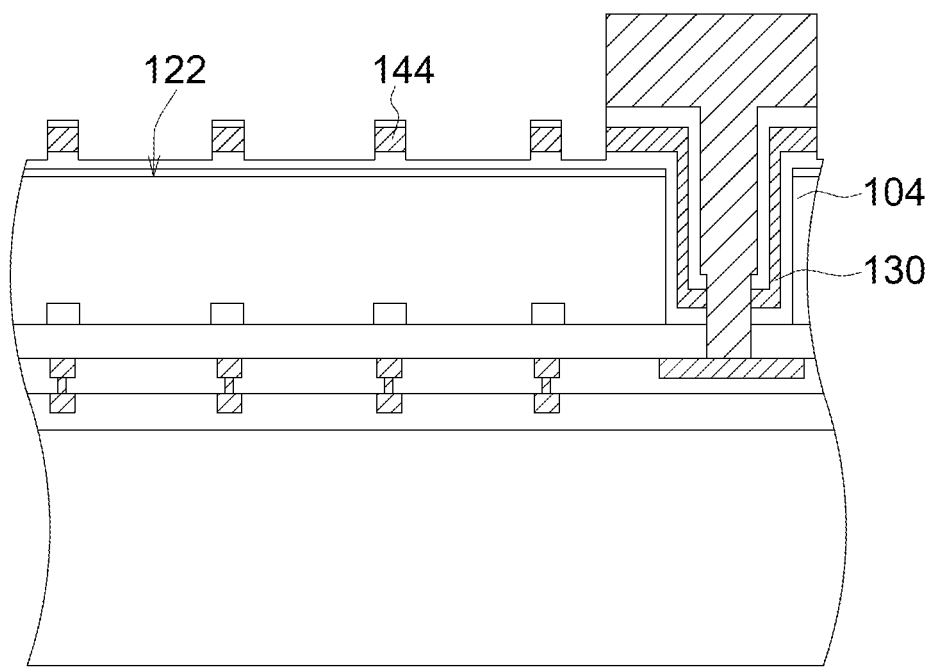

Referring to FIG. 7, a portion of the conductive film 130 on the back surface 122 of the semiconductor substrate 104 may be patterned by a photolithography to form a (metal) shield pattern 144. In embodiments, the shield pattern 144 is formed by patterning the conductive film 130, and no additional film is formed for the shield pattern 144. Therefore, the process is simplified, and manufacturing cost is decreased. For example, the patterning process may be performed by a wet etching, dry etching, etc. The shield pattern 144 may be functioned as a light-shielding structure.

In embodiments, other steps not illustrated herein may be performed among or after the above-mentioned steps. For example, a color filter array and a micro lens may be disposed on the back surface 122 of the semiconductor substrate 104.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
a semiconductor substrate comprising:
a conductive structure on an active surface of the semiconductor substrate, wherein the semiconductor substrate has a substrate opening passing there through and exposing the conductive structure;
a conductive film;
a dielectric layer in the substrate opening and under the conductive film;
a dielectric film; and
a conductive plug, wherein the conductive film, the conductive plug and the dielectric film between the conductive film and the conductive plug are disposed in the substrate opening.

2. The semiconductor structure according to claim 1, wherein the conductive plug is electrically connected to the conductive film and the conductive structure.

3. The semiconductor structure according to claim 1, wherein the dielectric film and the conductive film in the substrate opening have L shape.

4. The semiconductor structure according to claim 1, wherein the dielectric layer in the substrate opening has L shape.

5. The semiconductor structure according to claim 1, wherein the substrate opening comprises:
a trench passing through the semiconductor substrate; and
a via passing through the conductive film and the dielectric film.

6. The semiconductor structure according to claim 5, wherein the conductive film and the dielectric film are disposed in the trench, the via is filled by the conductive plug.

7. The semiconductor structure according to claim 1, further comprising a shield pattern on a back surface opposing to the active surface of the semiconductor substrate.

8. The semiconductor structure according to claim 7, further comprising a dielectric layer between the back surface of the semiconductor substrate and the shield pattern.

9. The semiconductor structure according to claim 7, wherein the shield pattern comprises a metal.

10. The semiconductor structure according to claim 1, further comprising a conductive pad protruding beyond a back surface opposing to the active surface of the semiconductor substrate, and electrically connected to the conductive plug.

11. The semiconductor structure according to claim 10, wherein the dielectric film is extended on the back surface of the semiconductor substrate, the conductive pad is disposed on an upper surface of the dielectric film of the back surface of the semiconductor substrate.

12. The semiconductor structure according to claim 1, which is a CMOS image sensor (CIS).

13. A method for manufacturing a semiconductor structure, comprising:
providing a semiconductor substrate comprising:
a conductive structure on an active surface of the semiconductor substrate;
forming a substrate opening in the semiconductor substrate, wherein the substrate opening passes through the semiconductor substrate and exposes the conductive structure;
forming a dielectric layer in the substrate opening;
forming a conductive film in the substrate opening, wherein the dielectric layer is under the conductive film;
forming a dielectric film in the substrate opening; and
forming a conductive plug in the substrate opening, wherein the dielectric film is between the conductive film and the conductive plug.

14. The method for manufacturing the semiconductor structure according to claim 13, wherein a method for forming the substrate opening comprises etching the semiconductor substrate from a back surface opposing to the active surface of the semiconductor substrate.

15. The method for manufacturing the semiconductor structure according to claim 13, wherein a method for forming the substrate opening comprises:
removing a portion of the semiconductor substrate to form a trench of the substrate opening, wherein the conductive film and the dielectric film are formed in the trench; and
removing lower portions of the dielectric film and the conductive film to form a via of the substrate opening, wherein the via is filled by the conductive plug.

16. The method for manufacturing the semiconductor structure according to claim 15, further comprising forming a dielectric layer in the trench and under the conductive film, wherein a method for forming the via further comprises removing a lower portion of the dielectric layer.

17. The method for manufacturing the semiconductor structure according to claim 13, further comprising:

forming the conductive film on a back surface opposing to the active surface of the semiconductor substrate; and patterning the conductive film on the back surface of the semiconductor substrate to form a shield pattern.

18. The method for manufacturing the semiconductor structure according to claim 13, comprising:

forming a conductive material in the substrate opening and on a back surface opposing to the active surface of the semiconductor substrate, wherein a portion of the conductive material in the substrate opening forms the conductive plug; and patterning a portion of the conductive material on the back surface of the semiconductor substrate to form a conductive pad.

* * * * *